United States Patent [19]

Matsuzawa et al.

[11] Patent Number: 5,164,728
[45] Date of Patent: Nov. 17, 1992

[54] A/D CONVERTER WITH COMPLEMENTARY INTERPOLATING VOLTAGE DIVIDERS

[75] Inventors: Akira Matsuzawa, Neyagawa; Haruyasu Yamada, Hirakata, both of Japan

[73] Assignee: Matsushita Electric Industrial Co., Ltd., Osaka, Japan

[21] Appl. No.: 711,014

[22] Filed: Jun. 6, 1991

[30] Foreign Application Priority Data

Jun. 11, 1990 [JP] Japan .................................. 2-151987

[51] Int. Cl.⁵ .......................................... H03M 1/36
[52] U.S. Cl. .................................... 341/159; 341/161
[58] Field of Search ..................... 341/156, 159, 161

[56] References Cited

U.S. PATENT DOCUMENTS

| | | | |
|---|---|---|---|
| 4,831,379 | 5/1989 | van de Plassche | 341/156 |
| 4,912,469 | 3/1990 | Van De Grift et al. | 341/159 |
| 4,928,103 | 5/1990 | Lane | 341/159 |
| 5,019,820 | 5/1991 | Matsuzawa et al. | 341/156 |

OTHER PUBLICATIONS

IEEE Journal of Solid-State Circuits, Special Issue on Analog Circuits, Dec. 1982, vol. SC-17, No. 6, (ISSN 0018-9200), pp. 1133-1138.

Primary Examiner—Marc Hoff
Attorney, Agent, or Firm—Stevens, Davis, Miller & Mosher

[57] ABSTRACT

A parallel type analog to digital (A/D) converter in which an input signal and reference voltages are differentially amplified by differential converting circuits, interpolation resistors are inserted between the outputs and between the complementary outputs of the differential converting circuits, and a tap voltage between the interpolation resistors is A/D converted, so that the A/D converter can operate at a high accuracy and at a high speed.

2 Claims, 4 Drawing Sheets

A/D CONVERTER WITH COMPLEMENTARY INTERPOLATING VOLTAGE DIVIDERS

BACKGROUND OF THE INVENTION

1. Field of the Invention

The present invention relates to a parallel type analog to digital (A/D) converter.

2. Description of the Related Art

FIG. 4 shows a conventional parallel type A/D converter. The parallel type A/D converter has: a comparing circuit array 11 comprising a plurality of comparing circuits in which an input signal 2 is commonly supplied to one input terminal of each of the comparing circuits and reference voltages of reference voltage generating means comprising a reference voltage 3 and a reference resistor array 10 are applied to the other input terminals; and a logic processing circuit 7 for obtaining a digital conversion output 8 by logically processing comparison outputs from the comparing circuit array 11.

In the above construction, for the comparison outputs of the comparators, all of the comparators whose reference voltages are higher than the input signal 2 generate the comparison outputs at the 0 level and all of the comparators whose reference voltages are lower than the input signal 2 generate the comparison outputs at the 1 level on the assumption that the comparator whose comparison voltage is closest to the input signal 2 is used as a boundary comparator. Therefore, if a logic processing circuit 7 executes a logic process such as an exclusive OR or the like of the comparison outputs of the adjacent comparators and supplies an output of the exclusive OR to an encoding circuit, the digital conversion output 8 can be obtained. Such a conventional parallel type A/D converter can execute the A/D conversion at the highest speed due to its parallel characteristic. For example, please refer to the following literature by Takemoto for such a conventional parallel type A/D converter.

(Takemoto et al., "A fully Parallel 10-Bit A/D Converter with Video Speed", IEEE J., Solid-State Circuits, Vol. SC-17, pp. 1133 to 1138, December, 1982)

However, in such a conventional parallel type A/D converter, a high voltage accuracy of the comparator is necessary as a resolution rises. For instance, in the case of the accuracy of 10 bits, a difference between the reference voltages of the adjacent comparators is equal to about 2 mV. Therefore, a comparison voltage accuracy of a fraction of such a differential voltage is required for each comparator. It is very difficult to realize such a voltage accuracy and a yield is remarkably deteriorated. Costs are increased. Sizes of electronic elements constructing the comparator are increased. An electric power consumption increases or a high frequency characteristic is deteriorated. Further, since the number of comparators which are connected to the input signals increases with an increase in resolution, an input capacitance increases. This makes it difficult to drive high frequency input signal. A Distoration is increase and conversion accuracy is deteriorated. Similarly, since the number of comparators which are connected to the reference resistor array increases, an increase in voltage drop by an input, bias current of the comparator causes the conversion accuracy to be remarkably deteriorated. In the conventional parallel type A/D converter, it is difficult to realize an A/D converter of a high accuracy for the above reasons.

SUMMARY OF THE INVENTION

The invention is made in consideration of the foregoing problems and it is an object of the invention to provide a parallel type A/D converter of a high speed, a high accuracy, a small distortion for a high frequency signal, and low costs.

To solve the above problems, according to the invention, there is provided a parallel type A/D converter comprising: reference voltage generating means for generating a plurality of reference voltages; a differential converting circuit array constructed of a plurality of differential converting circuits in which an input signal is commonly supplied to one input terminal of each of the differential converting circuits and respective reference voltages are supplied to the other input terminals and each of which converts a potential difference between the input terminals into a differential output voltage; an interpolating circuit array constructed of a plurality of interpolating circuits corrected in series, each for dividing a voltage between output terminals and a voltage between complementary output terminals respectively the adjacent differential converting circuits in the differential converting circuit array and for sequentially interpolating the voltage and the complementary voltage thereof; comparing circuit array constructed of a plurality of comparing circuits for sequentially comparing interpolation voltages in the interpolating circuit array; and a logic processing circuit for obtaining a digital conversion output by logically processing outputs of the comparing circuits in the comparing circuit array.

According to the invention, the voltages which are respectively applied to the input terminals of the comparing circuits are the voltages which are obtained by amplifying potential differences between the input signal and the reference voltages in the differential converting circuits. Therefore, a variation in comparison voltages of the comparing circuits appears at the input terminal as a value which has been reduced by only a gain component of the differential converting circuit. Therefore, for instance, in the conventional parallel type A/D converter, even when comparing circuits which can realize only a resolution of eight bits are used, by setting a gain of the differential converting circuit to 4 or more, a parallel type A/D converter of a resolution of ten bits can be realized.

Further, since only the differential converting circuits are connected between the input signal and the reference resistor array, the number of nodes of the circuit to the input signal and the reference resistor array can be reduced to a value which is about ¼ to 1/16 of that in the conventional parallel type A/D converter. Consequently, it is possible to realize a parallel type A/D converter in which an input capacitance and an input bias current can be remarkably reduced, a high frequency input signal can be easily driven, a distortion is reduced, and a conversion accuracy is improved.

DESCRIPTION OF THE PREFERRED EMBODIMENTS

Figure 1:
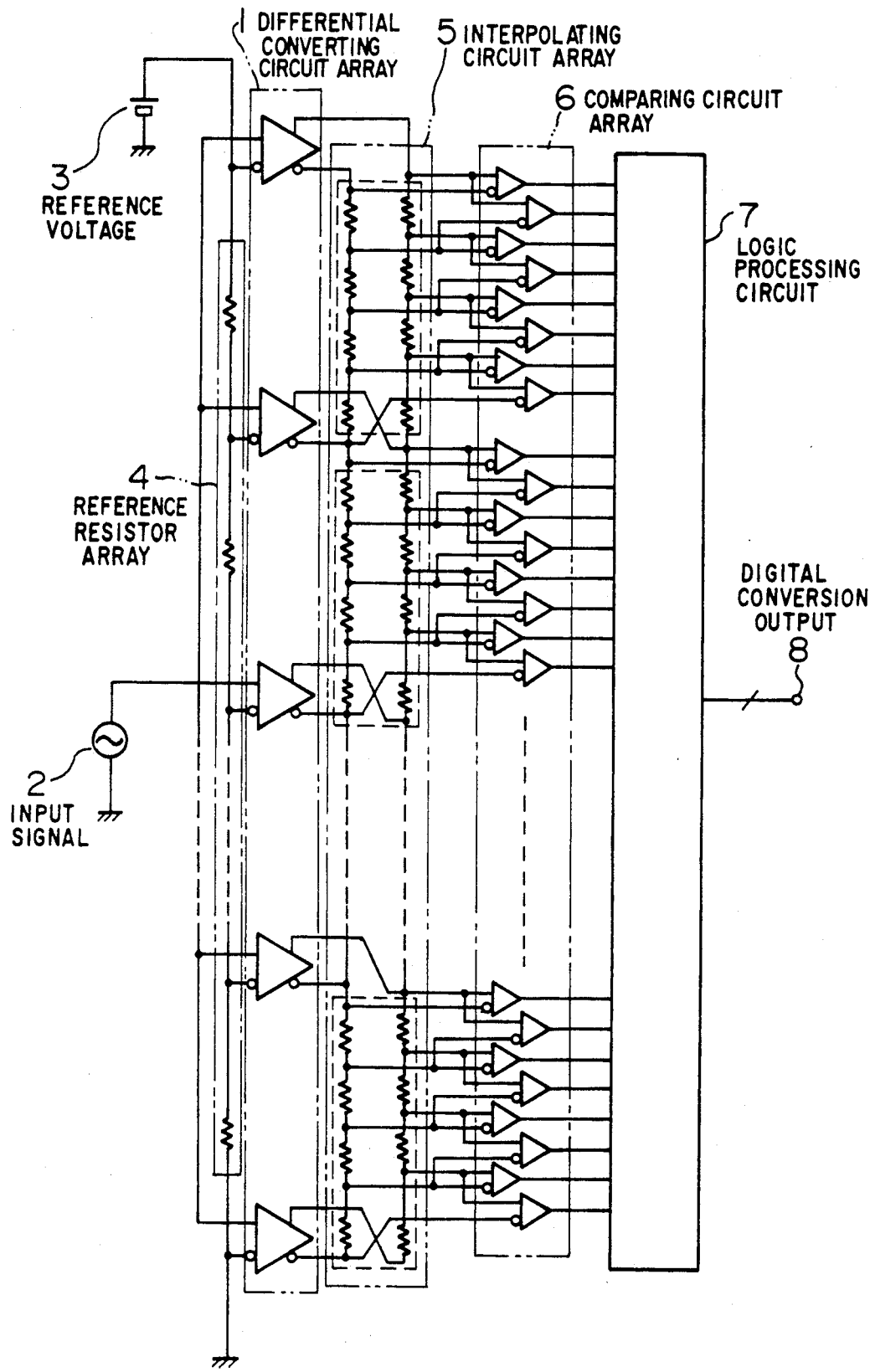
FIG. 1 is a circuit constructional diagram of an embodiment of the invention.

FIG. 1 shows a circuit constructional diagram of a parallel type A/D converter according to an embodiment of the invention.

In the diagram, the input signal 2 is commonly supplied to one input terminal of each of differential converting circuits of a differential converting circuit array 1 comprising a plurality of differential converting circuits each for converting a potential difference between the input terminals into a differential output voltage. Respective reference voltages of reference voltage generating means for generating a plurality of reference voltages which is constructed by the reference voltage 3 and a reference resistor array 4 are supplied to the other input terminals of the differential converting circuits. Outputs of the differential converting circuits are supplied to an interpolating circuit array 5 comprising resistors for dividing a voltage between the output terminals and a voltage between complementary output terminals of the adjacent differential converting circuits in the differential converting circuit array 1 and for sequentially interpolating the differential output voltage and its complementary voltage. Respective interpolation voltages in the interpolating circuit array 5 are compared by a comparing circuit array 6 comprising a plurality of comparing circuits for sequentially comparing the interpolation voltages in the interpolating circuit array 5. Comparison outputs of the comparing circuit array 6 are converted into the digital conversion output 8 by the logic processing circuit 7 which receives those comparison outputs. The digital conversion output 8 is generated.

Figure 2:
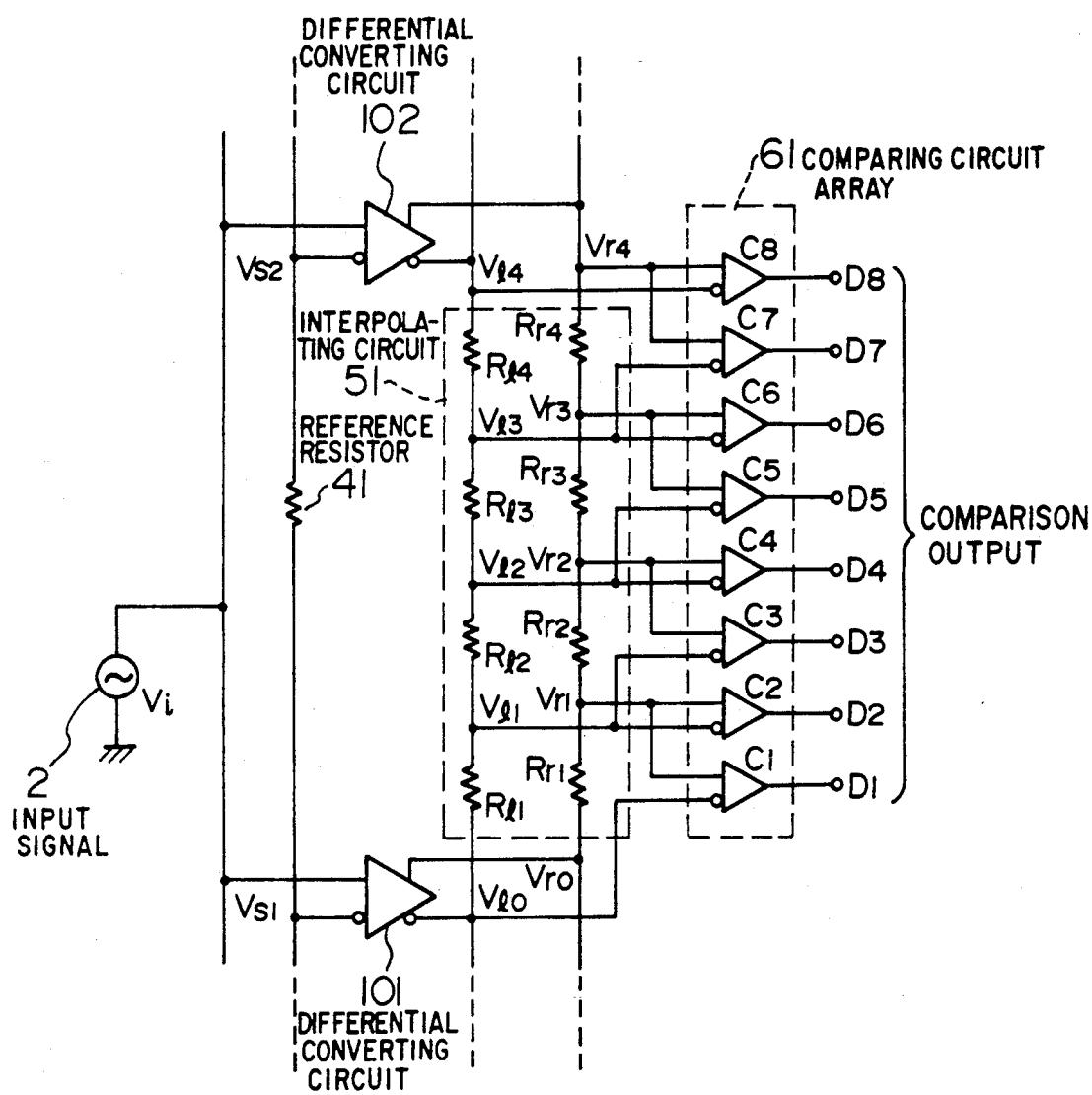
FIG. 2 is a circuit constructional diagram of a unit circuit in FIG. 1.
Figure 3:
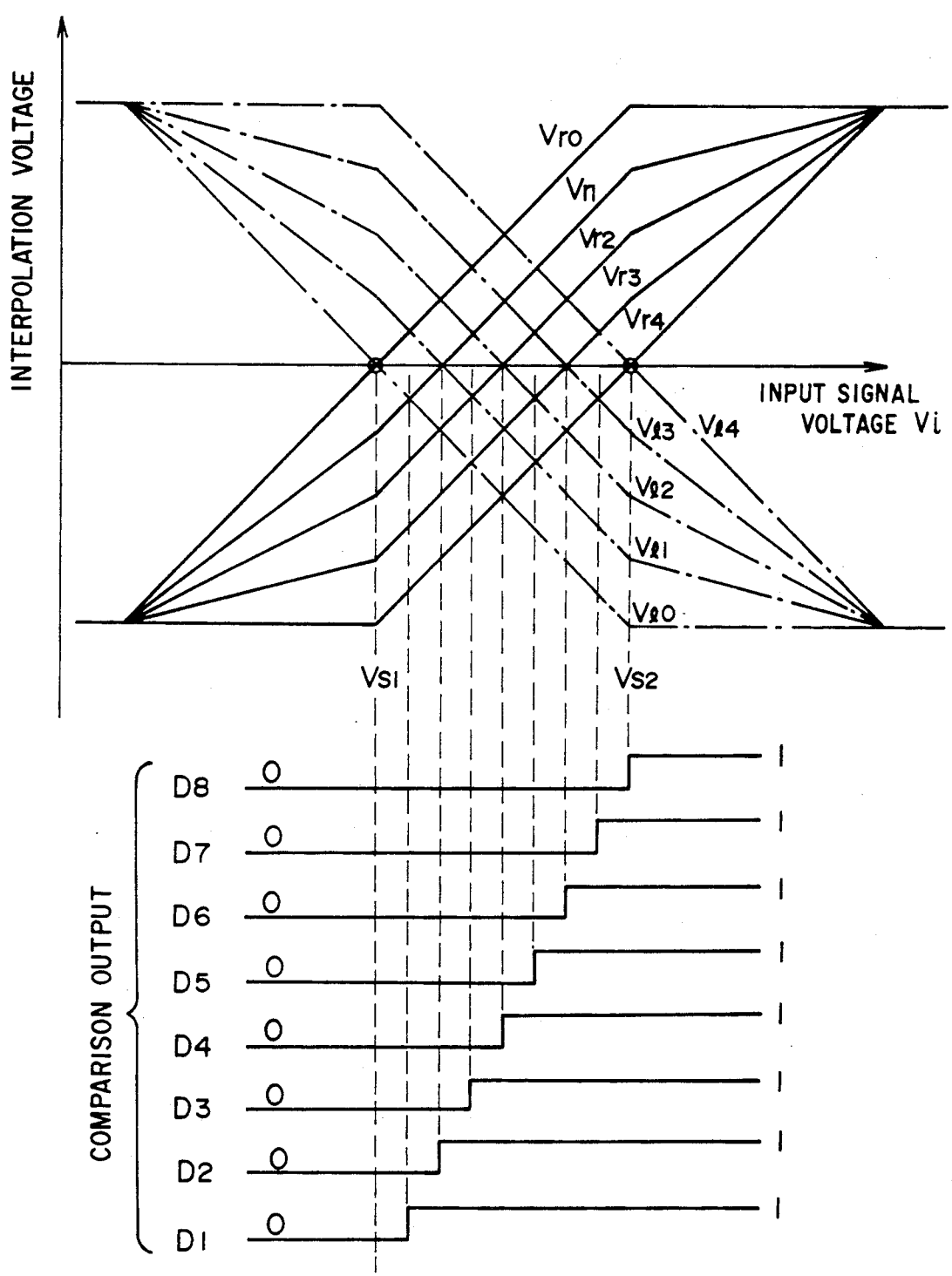
FIG. 3 is an operation characteristic diagram showing an operation waveform in each section of the unit circuit.
Figure 4:
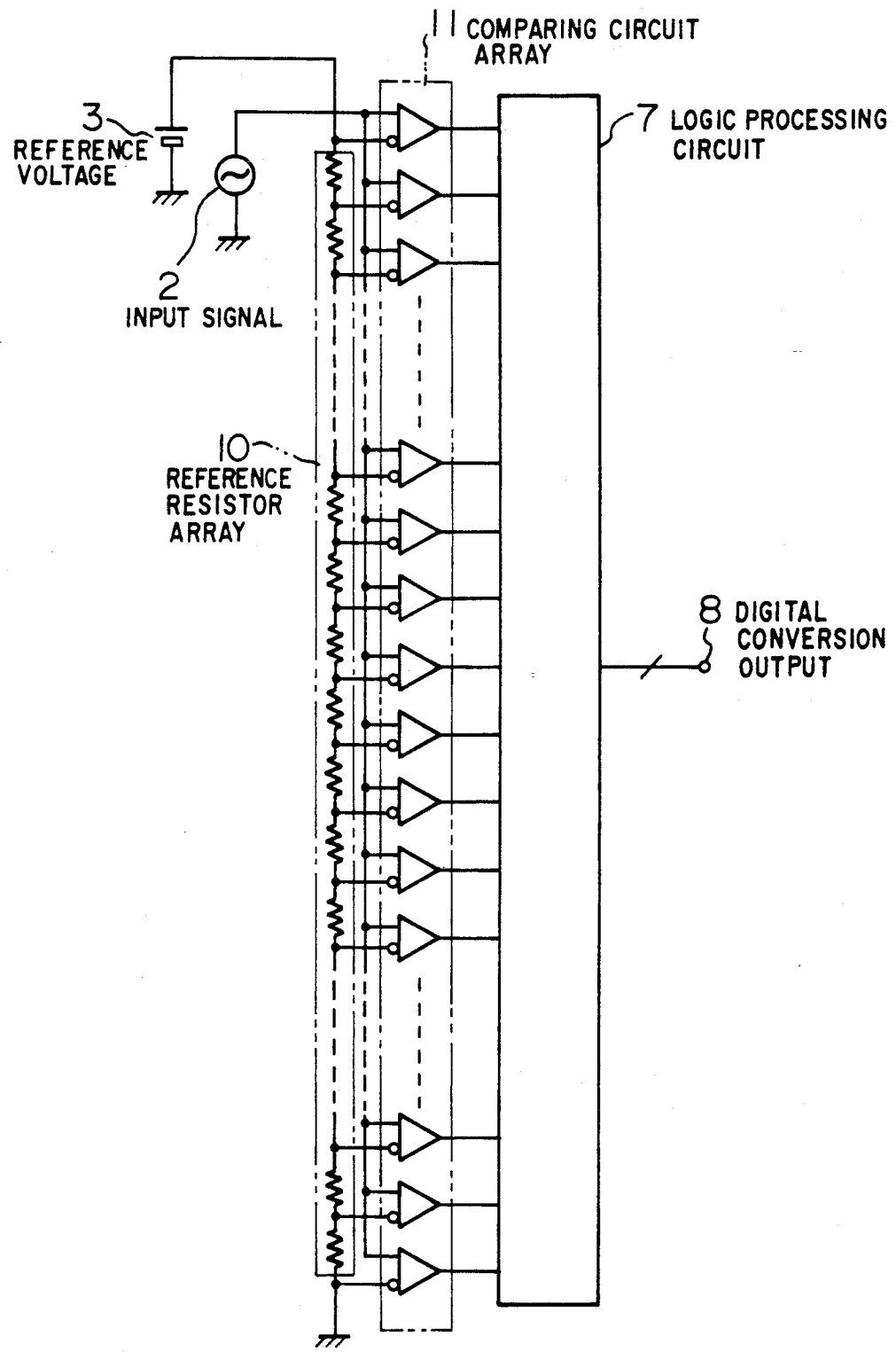
FIG. 4 is a circuit constructional diagram of a conventional parallel type A/D converter.

Since the parallel type A/D converter in FIG. 1 can be regarded as a repetition of the unit circuit having eight comparing circuits between the adjacent differential converting circuits, by showing the operation of such a unit circuit, the whole operation can be easily presumed. FIG. 2 shows the unit circuit. FIG. 3 shows an operation waveform in each section of the unit circuit.

FIG. 2 is a circuit constructional diagram of the unit circuit. An input signal Vi 2 is commonly supplied to one input terminal of each of adjacent differential converting circuits 101 and 102. A reference resistor 41 is inserted between the other input terminals of the differential converting circuits 101 and 102. Reference voltages $Vs_1$ and $Vs_2$ are supplied to the other input terminals, respectively. An interpolating circuit 51 comprising a cascade connection of resistors $Rr_1$ to $Rr_4$ is inserted between output terminals of the differential converting circuits 101 and 102. An interpolating circuit 51 comprising a cascade connection of resistors $Rl_1$ to $R_4$ is inserted between complementary output terminals of the differential converting circuits 101 and 102. Thus, interpolation voltages $Vr_0$ to $Vr_4$ and $Vl_0$ to $Vl_4$ are generated. The interpolation voltages are connected to input terminals of comparing circuits of a comparing circuit array 61 comprising comparing circuits $C_1$ to $C_8$, respectively. Comparison outputs $D_1$ to $D_8$ are generated at comparison output terminals of the comparing circuits $C_1$ to $C_8$, respectively.

FIG. 3 shows the interpolation voltages $Vr_0$ to $Vr_4$ and $Vl_0$ to $Vl_4$ and the comparison outputs $D_1$ to $D_8$ for the input signal voltage Vi. The output $Vr_0$ and complementary output $Vl_0$ of the differential converting circuit 101 respectively increases and decreases for the input signal voltage Vi, respectively, and they intersect at the reference voltage $Vs_1$. Similarly, the output $Vr_4$ and complementary output $Vl_4$ of the differential converting circuit 102 increases and decreases for the input signal voltage Vi, respectively, and they intersect at the reference voltage $Vs_2$. The interpolation voltages $Vr_1$, $Vr_2$, and $Vr_3$ among the output voltages of the differential converting circuits are obtained by resistance dividing the voltage between $Vr_0$ and $Vr_4$. The interpolation voltages $Vl_1$, $Vl_2$, and $Vl_3$ among the complementary output voltages of the differential converting circuits are obtained by resistance dividing the voltage between $Vl_0$ and $Vl_4$. Therefore, assuming that all of the values of the interpolation resistors $Rr_1$ to $Rr_4$ and $Rl_1$ to $Rl_4$ forming the interpolating circuits are equal, an input voltage which gives intersections between the interpolation voltages $Vr_0$ to $Vr_4$ among the output voltages of the differential converting circuits and the interpolation voltages $Vl_0$ to $Vl_4$ among the complementary output voltages equivalently divides the voltage between the reference voltages $Vs_1$ and $Vs_2$. Therefore, if the interpolation voltages $Vr_0$ to $Vr_4$ among the output voltages and the interpolation voltages $Vl_0$ to $Vl_4$ among the complementary output voltages are compared by the comparing circuits $C_1$ to $C_8$ and the comparison outputs are logically processed, the A/D conversion can be performed.

In the connection shown in FIG. 2, the comparison outputs $D_1$ to $D_8$ are sequentially turned on from the reference voltage $Vs_1$ to $Vs_2$ as shown in FIG. 3. There are various Combinations of the interpolation voltages which are connected to the comparators in dependence on a code system which is used or the like. It will be readily apparent that the invention is not limited by such a combination.

FIG. 3 shows a case of constructing a 3-bit parallel type A/D converter with respect to the case where the reference voltages are set to $Vs_1$ and $Vs_2$. However, if the unit circuit shown in FIG. 2 is repetitively connected as shown in FIG. 1, a parallel type A/D converter of a higher resolution can be realized.

In this embodiment, a potential difference which is obtained by amplifying a potential difference between the input signal Vi and the reference voltage $Vs_1$ or $Vs_2$ in the differential converting circuit is applied to one input terminal of each of the comparators constructing the comparing circuit array 61. In the interpolating circuit 51, each of the interpolation voltages $Vr_0$ to $Vr_4$ and $Vl_0$ to $Vl_4$ has the same gain as that of the differential converting circuit as shown in FIG. 3. Therefore, now assuming that a gain of the differential converting circuit is set to G and a comparison voltage variation of the comparing circuits is set to $\Delta Vc$, an input conversion comparison voltage variation $\Delta Vci$ indicative of a comparison voltage accuracy for the input signal Vi can be expressed by the following equation.

$$\Delta Vc_i = \Delta Vc/G$$

From the above equation, it will be understood that by setting the gain G of the differential converting circuit to an enough large value, the input conversion comparison voltage variation $\Delta Vci$ can be reduced. For instance, now assuming that the comparison voltage variation $\Delta Vc$ of the comparing circuits is set to an accuracy of eight bits and the gain G is equal to 4 or more and the same comparing circuits are used, a parallel type A/D converter of a 10-bit accuracy can be realized.

In the invention, further, since only the differential converting circuits are connected to the input signal 2 and the reference resistor array 4, the number of nodes of the circuits to the input signal 2 and the reference resistor array 4 can be reduced to a value of about ¼ to 1/16 of that of the conventional parallel type A/D converter. Thus, it is possible to realize a parallel type A/D converter in which the input capacity and the input bias current can be remarkably reduced, the high frequency input signal can be easily driven, distortion is reduced, and conversion accuracy is improved.

We claim:

1. A parallel type analog to digital converter comprising:

reference voltage generating means for generating a plurality of reference voltages;

a differential converting circuit array constructed of a plurality of differential converting circuits in which an input signal is commonly supplied to one input terminal of each of the differential converting circuits and respective ones of said reference voltages are supplied to the other input terminals and each of which converts a potential difference between its input terminals into a differential output voltage;

an interpolating circuit array constructed of a plurality of interpolating circuits connected in series, each for dividing a voltage between output terminals and a complementary voltage between complementary output terminals respectively of adjacent differential converting circuits in the differential converting circuit array and for sequentially interpolating the voltage and the complementary voltage thereof;

a comparing circuit array constructed of a plurality of comparing circuits for sequentially comparing interpolation voltages in the interpolating circuit array; and a logic processing circuit for obtaining a digital conversion output by logically processing outputs of the comparing circuits in the comparing circuit array.

2. A parallel type analog to digital converter according to claim 1, wherein each of said plurality of interpolating circuits comprises resistors connected in series for dividing the voltage between the output terminals and the complementary voltage between the complementary output terminals respectively of adjacent differential converting circuits in the differential converting circuit array and for sequentially interpolating the voltage and the complementary voltage thereof.

* * * * *